(12) United States Patent
Gherardi et al.

(10) Patent No.: US 6,299,948 B1
(45) Date of Patent: Oct. 9, 2001

(54) METHOD AND DEVICE FOR SURFACE TREATMENT WITH A PLASMA AT ATMOSPHERIC PRESSURE

(75) Inventors: Nicolas Gherardi; Gamal Gouda; Françoise Massines, all of Toulouse; Alain Villermet, Viroflay; Eric Gat, Cornillon-Confoux, all of (FR)

(73) Assignees: L'Air Liquide, Societe Anonyme pour l'Etude et l'Exploitation des Procedes Georges Claude, Paris (FR); Softal Electronic, Hamburg (DE)

( * ) Notice: Subject to any disclaimer, the term of this patent is extended or adjusted under 35 U.S.C. 154(b) by 0 days.

(21) Appl. No.: 09/288,610

(22) Filed: Apr. 9, 1999

(30) Foreign Application Priority Data

Aug. 28, 1998 (FR) .................................................. 98 10814

(51) Int. Cl.$^7$ ................................ H05H 1/46; B05D 3/14
(52) U.S. Cl. ......................... 427/569; 427/536; 427/579; 427/539; 216/71
(58) Field of Search ..................................... 427/569, 579, 427/578, 539, 534, 535, 536; 438/788, 789; 216/67, 71

(56) References Cited

U.S. PATENT DOCUMENTS

| 5,041,304 | * | 8/1991 | Kusano et al. | 427/569 |
| 5,124,173 | * | 6/1992 | Uchiyama et al. | 427/569 |
| 5,304,407 | * | 4/1994 | Hayashi et al. | 427/579 |
| 5,384,167 | | 1/1995 | Nishiwaki et al. . | |
| 5,523,124 | * | 6/1996 | Slootman et al. | 427/579 |
| 5,576,076 | * | 11/1996 | Slootman et al. | 427/579 |

FOREIGN PATENT DOCUMENTS

| 0 346 055 A | 12/1989 | (EP) . |
| 0 619 694 A | 10/1994 | (EP) . |
| 94 28568 | 12/1994 | (WO) . |

* cited by examiner

*Primary Examiner*—Marianne Padgett

(57) ABSTRACT

Method for creating an electric discharge in an initial gas which is at atmospheric pressure and lies between two exciting electrodes, comprising applying a supply voltage to the two electrodes which is an AC voltage whose amplitude and frequency are adapted in order to maintain (1) at least a portion of the components of the gas in the excited state, and/or (2) the presence of electrons, between two successive half-cycles of the supply voltage.

13 Claims, 3 Drawing Sheets

METHOD AND DEVICE FOR SURFACE TREATMENT WITH A PLASMA AT ATMOSPHERIC PRESSURE

BACKGROUND OF THE INVENTION (i) Field of the Invention

The present invention relates to a method and to a device for creating a uniform discharge at atmospheric pressure (non-filamentary) in a gas, in particular in nitrogen or in a gas mixture based on nitrogen, and to its application in particular to surface treatment using a plasma at atmospheric pressure or alternatively to the breakdown of effluents.

(ii) Description of Related Art

One of the applications relates more particularly to treatments for modifying the surface characteristics of a polymer film with a view, for example, to modifying its wettability or forming chemical bonds capable of improving the adhesion of a future coating.

In methods for surface treatment using a plasma, the surface to be treated is traditionally brought into contact with a plasma created by ionizing a treatment gas so as to create excited chemical species and electrons, which in particular can collide with third species (in particular neutral ones).

These collisions can cause energy to be transferred to the species so as to form new chemically active species, in particular so-called "metastable" species, atomic species, radicals, ions and electrons. Chemically active species with a long lifetime can in turn collide with third species, which can thus create other active species and electrons.

The active species can interact with the surface of an article in contact with the gas, which makes it possible to modify the surface characteristics of this article, on the one hand creating new molecular structures capable of interacting with the molecules of a coating deposited later, and on the other hand modifying the morphology of the material and, in particular, the mobility of chains or chain segments in the case of polymers.

It is known that electric discharges at atmospheric pressure have the advantages, on the one hand, of not requiring the use of bulky and expensive devices for creating a powerful vacuum in the treatment reactor in which the discharge is formed and, on the other hand, of permitting continuous treatments which are compatible with productivity requirements.

The electric discharges employed at atmospheric pressure, such as "corona" discharges, are generally referred to as "filamentary" since they are generated in the form of sorts of current microchannels, typically some hundred microns in diameter, which develop randomly in space and time between the two electrodes.

However, it has been found that such a "filamentary" discharge technique is not efficient enough at the microscopic level because it has a number of drawbacks at the microscopic level. Specifically, the discharge created in this way is microscopically nonuniform since, firstly, between two filaments, the surface has untreated regions and furthermore, even at the individual filaments, the treated surface is liable to be degraded by an excessive number of polymer chain breaks or even local heating.

Attempts have been made to overcome this drawback by subjecting the surface to be treated to a uniform discharge, that is to say a discharge in which the excited chemical species are regularly distributed over the surface to be treated, while of course maintaining atmospheric pressure conditions (specifically, attempts could have been made to make the discharge uniform by reducing the pressure).

It is thus known to produce a uniform discharge at atmospheric pressure in a neutral gas, essentially helium (reference may for example be made to documents U.S. Pat. No. 5,456,972 and EP-A-346 055). However, for treating surfaces with such a plasma created in a gas based on nitrogen, at least one electrode in the form of a grill is still used.

However, work carried out by the Applicant Company has shown that such electrodes do not make it possible for the uniformity of the discharge created to be improved satisfactorily at the microscopic level.

SUMMARY AND OBJECTS OF THE INVENTION

The object of the invention is to overcome this drawback and to provide a method for creating a uniform electric discharge in nitrogen, or a gas containing nitrogen, making it possible in particular to improve the conditions of surface treatment with a plasma at atmospheric pressure.

It therefore relates to a method for creating an electric discharge in an initial gas which is at atmospheric pressure and lies between two exciting electrodes, by applying a supply voltage to the two electrodes, which is characterized in that the supply voltage is an AC voltage whose amplitude and frequency are adapted in order to maintain at least a portion of the components of the gas in the excited state, and/or the presence of electrons, between two successive half-cycles of the supply voltage.

As will be illustrated in more detail further on in the present application, the method according to the invention avoids the conditions of strong field and breakdown voltage typically characteristic of the filamentary mode, by making it possible to create and maintain, between two discharges (i.e. between two half-cycles), sufficient quantities of metastable species and electrons for each discharge to start with a low electric field value (the metastable species relax, for example, on contact with a third species to create an electron and an ion of this third species itself or of the metastable species). The electrons lead to avalanches which produce ions, accelerated toward the cathode, which cause secondary emission of electrons at the cathode, etc.

The method for creating a discharge according to the invention may further- have one or more of the following characteristics, taken individually or in any technically feasible combinations :

- the supply voltage lies between about 5 kV and 30 kV, with a more preferential embodiment in the range of from 10 kV to 25 kV, and the frequency of the voltage lies between about 200 Hz and 35 kHz, with a preferential range of less than or equal to 15 kHz;
- the initial gas is introduced into the inter-electrode space with a gas velocity of between 0 m/s and 10 m/s, with a preferential range of less than or equal to 5 m/s.
- the initial gas includes one or more of the gases in the group formed by nitrogen, silicon precursor gases, oxygen and gases capable of releasing oxygen such as $N_2$, $CO_2$, $NO_2$, $H_2O$ . . . ;
- the thickness of the gas space between the exciting electrodes is between about 0.5 and 5 mm;
- at least one of the electrodes is covered with a dielectric or semiconductor material (such as alumina, glass, polymer, etc.), the thickness of which advantageously lies in the range of from a few tens of microns to 1 cm, and preferably in the range of from 500 microns to 2 mm.

The invention also relates to a device for creating an electric discharge in a gas at atmospheric pressure, for implementing a method as defined above, including two exciting electrodes, a source for supplying the inter-electrode space with an initial gas and a voltage supply source which is connected to the exciting electrodes, and which is characterized in that the voltage supply source is capable of delivering an AC voltage whose amplitude and frequency are adapted in order to maintain at least a portion of the components of the gas in the excited state, and/or the presence of electrons, between two successive half-cycles of the voltage.

The invention also relates to a method for surface treatment with a plasma at atmospheric pressure, including the step of introducing a treatment gas into a treatment reactor, in which a surface to be treated is arranged between two exciting electrodes and applying a supply voltage to the two electrodes so as to cause the appearance of an electric discharge in the treatment gas, and which is characterized in that the supply voltage is an AC voltage whose amplitude and frequency are adapted in order to maintain at least a portion of the components of the treatment gas in the excited state, and/or the presence of electrons, between two successive half-cycles of the supply voltage.

The method for surface treatment according to the invention may furthermore have one or more of the following characteristics, taken individually or in any technically feasible combinations:

- the surface to be treated being capable of generating species liable to de-excite (relax) the active (excited or unstable) components in the gas which are needed for obtaining a uniform discharge, the proportion of said species liable to de-excite the gas is limited by implementing one or more of the following measures:
  - i) the treatment gas includes at least one component capable of interacting with said species liable to cause de-excitation to negate their detrimental effect;
  - j) the power of the discharge is controlled, the rate at which said species liable to cause de-excitation are generated being thus controlled;
  - k) the rate at which the treatment gas is replenished in the inter-electrode space is controlled.
- the supply voltage lies between about 5 kV and 30 kV, with a more preferential embodiment in the range of from 10 kV to 25 kv, and the frequency of the voltage lies between about 200 Hz and 35 KHz, with a preferential range of less than or equal to 15 kHz;
- the treatment gas is introduced into the inter-electrode space with a gas velocity of between 0 m/s and 10 m/s, with a preferential range of less than or equal to 5 m/s;
- the treatment gas includes one or more of the gases in the group formed by nitrogen, silicon precursor gases, oxygen and gases capable of releasing oxygen such as $N_2$, $CO_2$, $NO_2$, $H_2O$ . . . ;
- the thickness of the gas space between the exciting electrodes is between about 0.5 and 5 mm;
- at least one of the electrodes is covered with a dielectric or semiconductor material, the thickness of which advantageously lies in the range of from a few tens of microns to 1 cm, and preferably in the range of from 500 microns to 2 mm.

The invention also relates to a device for surface treatment with a plasma at atmospheric pressure, for implementing a method for surface treatment as defined above, having a treatment reactor including two exciting electrodes, between which an article to be treated is arranged, a source for supplying the reactor with a treatment gas at atmospheric pressure and a voltage supply source which is connected to the exciting electrodes and can deliver a supply voltage to them, the device being characterized in that the voltage supply source is capable of delivering to the electrodes an AC voltage which is adapted in order to cause the appearance of a discharge in the treatment gas and whose amplitude and frequency are capable of maintaining at least a portion of the components of the treatment gas in the excited state between two successive half-cycles of the supply voltage.

As seen above, the aim of the invention is to create, control and use uniform discharges, in particular in atmospheres based on nitrogen, and to do this at atmospheric pressure. It will, of course, be understood that it is possible to work at pressures lying a few tens of millibars, or even a few hundreds of millibars, either side of atmospheric pressure without departing from the scope of the present invention.

Other characteristics and advantages will become apparent from the following description, which is given solely by way of example and made with reference to the appended drawings.

DETAILED DESCRIPTION OF THE PREFERRED EMBODIMENT

Figure 1:
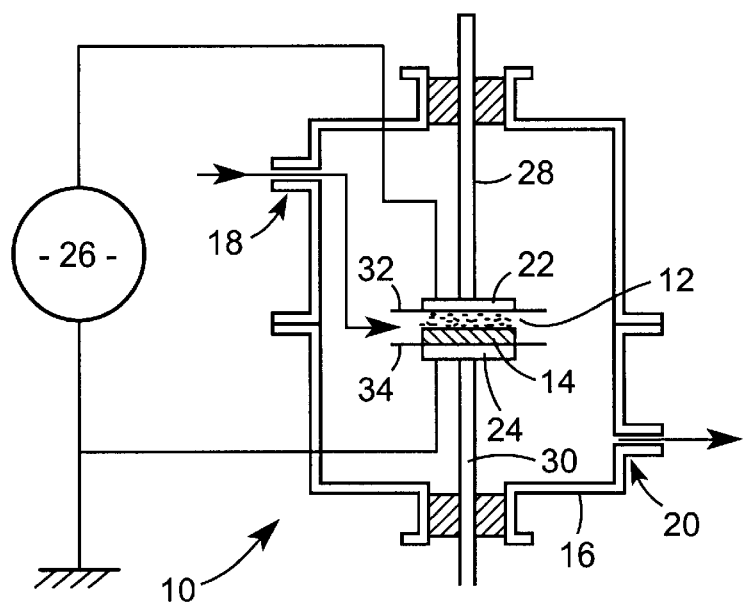
FIG. 1 is a schematic sectional view of a device for surface treatment according to the invention.

FIG. 1 schematically represents a device for surface treatment with a- plasma at atmospheric pressure, denoted by the overall numerical reference 10.

It is intended to generate a uniform discharge 12 by exciting a treatment gas, with a view to modifying the surface properties of an article 14 to be treated.

In the rest of the description, it will be assumed that the article 14 to be treated consists of a film of polymer, for example of polypropylene, but the invention also applies, of course, to the treatment of articles consisting of different materials.

As can be seen in FIG. 1, the reactor 16 is provided with a first orifice/injection system 18 in communication with a source (not shown) for supplying treatment gas, as well as a discharge orifice 20.

The treatment gas consists, for example, of nitrogen.

The injection 18 and discharge 20 orifices are each provided with suitable means, of the conventional type, for controlling the gas flow rate inside the reactor 16.

Two exciting electrodes, 22 and 24 respectively, between which the article to be treated is arranged extend parallel inside the reactor 16.

They each consist, for example, of a metal disc and are each connected to a source 26 for supplying AC voltage, the applied voltage and excitation frequency of which can be adjusted in a predetermined range.

They are also each supported by an adjustment bar, 28 and 30 respectively, which is accessible from outside the reactor 16 so as to adjust the inter-electrode gas space in a range lying, for example, between about 0.5 and 5 mm.

Each electrode 22 and 24 is also covered with a layer, 32 and 34, of a dielectric or semiconducting material suitable for the use in question, for example alumina.

As can be seen in this FIG. 1, the article 14 to be treated is, in the case of the embodiment represented, placed on one of the exciting electrodes, (i.e. on the material covering one of the electrodes).

As mentioned above, the discharge 12 is obtained by exciting the electrodes 22 and 24 using the supply source 26.

In order to do this, and with a view to obtaining a uniform discharge 12, the supply voltage is fixed at a value lying between about 5 kV and 30 kV, considered peak to peak, and the frequency of the excitation voltage supplied between the electrodes 22 and 24 lies between about 200 Hz and 35 kHz, this being as a function of the thickness of the inter-electrode gas space, the flow of the treatment gas as well as the composition of the treatment gas.

In the case of nitrogen, for an inter-electrode distance close to 1 mm, the peak-to-peak value adopted for the supply voltage is thus advantageously close to 11 kV, and is advantageously equal to 24 kV when the inter-electrode distance is, for example, equal to 3 mm.

Figure 2:
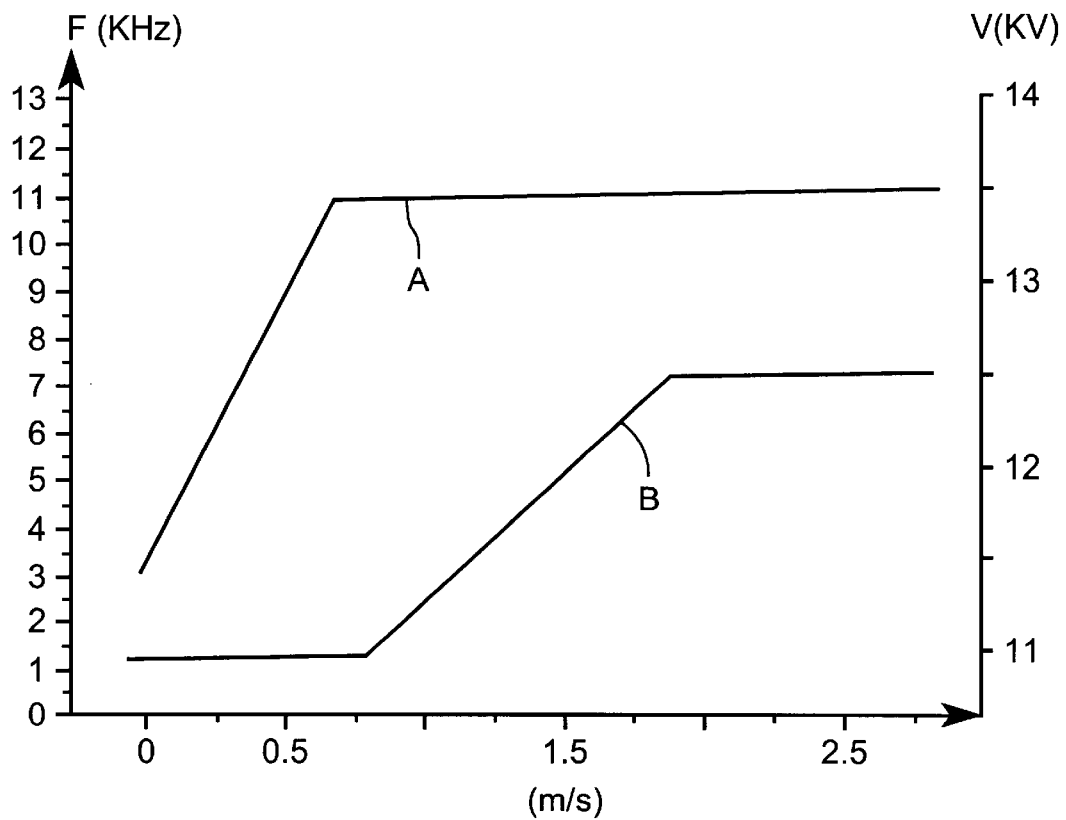
FIG. 2 illustrates the variation of the maximum frequency and voltage to be supplied, as a function of the velocity of the treatment gas, in order to obtain a uniform discharge.

Similarly, as can be seen in FIG. 2, in the case illustrated the maximum value of the voltage V and of the excitation frequency F is defined as a function of the velocity of the treatment gas. In these figures, which correspond to a thickness equal to about 1 mm for the inter-electrode gas space, the portion lying above the curves corresponds to operation under filamentary discharge conditions, while the part below each curve corresponds to operating conditions with uniform discharge. Curve A corresponds to the variation in the maximum frequency F as a function of the gas velocity, and curve B corresponds to the variation in the maximum supply voltage V as a function of the gas velocity.

It can thus be seen in this FIG. 2 that, for an inter-electrode distance equal to about 1 mm, and for a zero flow rate of the treatment gas (atmosphere introduced but not replenished), the maximum value of the excitation frequency F is fixed at about 3 kHz.

In this case (distance close to 1 mm), the supply voltage is close to 11 kV.

Similarly, with values higher than 2 m/s for the gas velocity, the maximum value of the excitation frequency is close to 11 kHz, while the supply voltage is close to 12.5 kV, still considered peak-to-peak.

Figure 3:
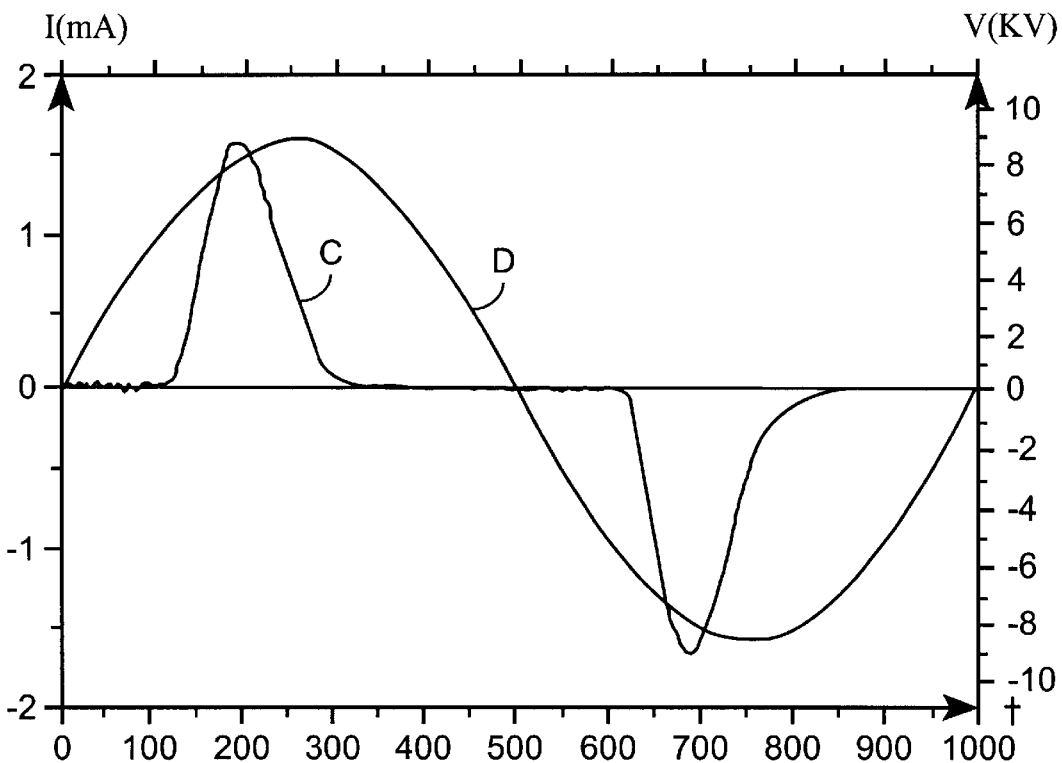
FIG. 3 (according to the invention) shows the variation, as a function of time, in the current and the supply voltage of the exciting electrodes, for a zero value of the velocity of the gas treatment (no replenishment of the atmosphere)
Figure 4:
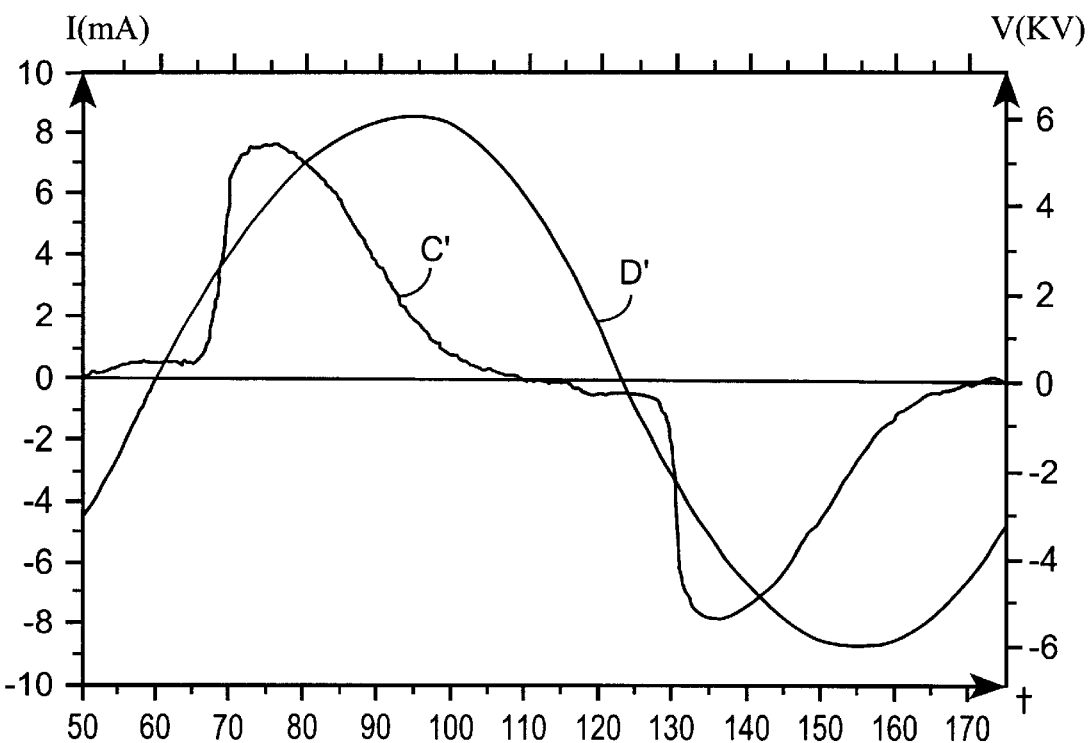
FIG. 4 (according to the invention) shows the variation, as a functional time, in the current and the supply voltage of the exciting electrodes, for a gas velocity equal to 1.5 m/s (and furthermore with a gas space of 1 mm, an excitation frequency of 8 kHz and an amplitude of 12 kV)

As can be seen in FIGS. 3 and 4, which represent the variation, as a function of time, in the discharge current I (curves C and C') and of the supply voltage V (curves D and D') respectively for a zero gas velocity (without replenishment of the gas, FIG. 3) and for a gas velocity of 1.5 m/s (FIG. 4), the maximum value of the frequency of the supply voltage is advantageously adopted in such a way as to maintain at least a portion of the components of the gas in the excited state, and/or the presence of electrons, between two successive half-cycles of the supply voltage.

These figures do actually show that, for each half-period of the supply voltage, the curve for the current as a function of time has a single peak, representing the fact that there is a single event in which electrons and ions are transferred from one electrode to the other. Following the peak, the value of the current is very low but not zero, representing the fact that at least a portion of the components of the gas are maintained in the excited state. A new excitation, taking place under the effect of the following half-cycle, occurs before all the excited species contained in the gas have been fully deexcited.

A sufficient number of excited species in the discharge, as well as electrons, is therefore maintained between two half-cycles of the supply voltage, which makes it possible to obtain ionization of the particles in the gas with a low electric field, and a discharge which is self-sustained by emission of electrons at the cathode.

These figures give a better illustration of the phenomena explained further above in the present description (explanations which, as will be understood, have been given by way of illustration without any limiting nature being attributable to them in view of the complexity of the mechanisms involved and the time which would be needed to verify them), according to which explanations sufficient quantities of metastable species and electrons are created and maintained between two discharges (i.e. between two half-cycles of the voltage) for each discharge to be initiated with a small value of the electric field, i.e. an electric field less than the breakdown electric field of the gas at rest. The metastable species relax, for example, on contact with a third species to create an electron and an ion of this same third species or of the metastable species, and the electrons give rise to avalanches which produce ions which are accelerated towards the cathode, thus causing secondary emission of electrons at the cathode, etc.

Let us now return to the case, already mentioned above, of surfaces to be treated which are capable of generating species liable to de-excite (relax) the active (excited or unstable) components of the gas which are needed for obtaining a uniform discharge in the gas: let us take the case of treating certain polymers, such as polypropylene, which tend to generate hydrogen under the effect of the discharge. The hydrogen generated in this way moreover tends to de-excite the excited species in the gas, in particular the metastable species of nitrogen. A treatment gas composition will then advantageously be adopted, according to the invention, which contains an element capable of interacting with the hydrogen particles (to negate their detrimental effect) so as to maintain the desired discharge conditions.

Thus, in the case of using a treatment gas containing nitrogen, of which it is desirable to keep the metastable species created in the discharge, a treatment gas will advantageously be used which further contains an oxidizing element, such as oxygen, or another element capable of releasing oxygen, such as $N_2$, $H_2O$, $CO_2$, $NO_2$, etc., the list just made being given solely by way of illustration, and without implying any limitation.

It will be noted, however, that since atomic oxygen is itself liable to relax the metastable species of nitrogen (albeit to a lesser extent than hydrogen does), the level of oxidizing gas in the treatment gas will have to be adjusted and controlled in reasonable compromise proportions.

Figure 5:
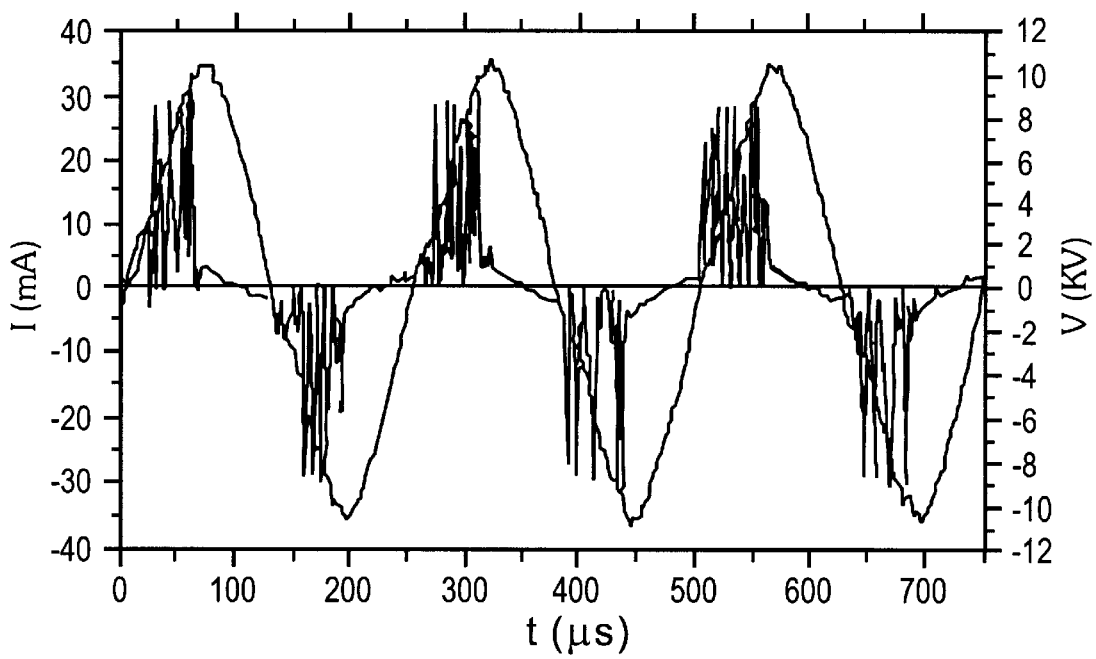
FIG. 5 (comparative) shows the variation, as a function of time, in the current and the supply voltage of the exciting electrodes, in the case of a filamentary discharge (comparative example, obtained for a gas velocity equal to 0 m/s, a gas space thickness of 3 mm, an excitation frequency of 4 kHz and an amplitude of 20.5 kV)

With FIGS. 3 and 4 having shown the spectacular result obtained according to the invention, namely of a uniform discharge characterized by a single peak demonstrating the fact that there is a single event in which electrons and ions are transferred from one electrode to the other, it is satisfying to see that, in comparison, FIG. 5 (comparative example) which was obtained under filamentary discharge conditions unequivocally has a current profile corresponding to discharge microchannels measuring some one hundred microns in diameter which develop randomly in space and time between the electrodes.

It will therefore have been gathered, from reading the description above, that the device and the treatment method which have just been described make it possible to obtain a uniform discharge.

Nevertheless, the Applicant Company has also demonstrated that a polypropylene film treated using this technique has improved wettability characteristics.

Figure 6:
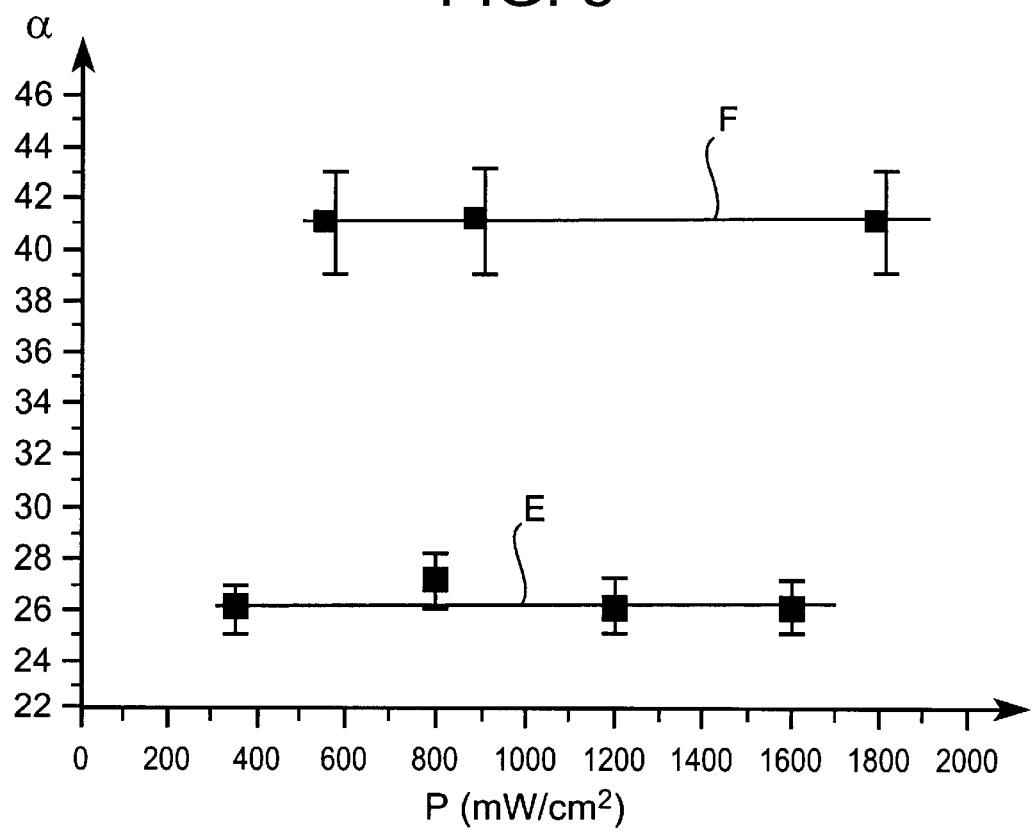
FIG. 6 shows curves illustrating the variation, as a function of the average power consumed in the discharge, in the angle formed by a water drop in contact with a surface treated under nitrogen, on the one hand, using a method according to the invention and, on the other hand, using a filamentary discharge.

In this regard, FIG. 6 represents the variation, as a function of the average power P consumed in the discharge, in the contact angle a of a water drop with the treated surface, characterizing the surface tension. Let us recall that the lower the contact angle $\alpha$ is, the more the water drop spreads over the surface, and the higher is the surface tension (small angles are therefore desired in general).

This FIG. 6 therefore clearly shows that a film treated using uniform discharge in nitrogen according to the invention (curve E) has a smaller contact angle than a film treated using filamentary discharge (curve F).

In the description which has just been given, examples were illustrated in which the treatment gas consists of nitrogen, optionally mixed with an oxidizing element.

According to other advantageous embodiments of the invention, it is also possible to use a treatment gas comprising nitrogen, or another carrier gas, and a silicon precursor gas, for example monosilane ($SiH_4$), so as to create chemical bonds on the surface of the article which are suitable for the deposition of future coatings, in particular groups such as $Si_xO_y$ or $Si_xO_yH_r$.

Such a treatment gas, containing a silicon precursor gas, could also of course advantageously contain an oxidizing element so as not only to reduce the de-excitation of the excited species in the gas, as mentioned above, but also to provide the oxygen needed for forming $Si_xO_y$ indeed $Si_x$-$O_yH_r$ compounds containing oxygen atoms.

The method for surface treatment according to the invention can therefore have the aim of making a deposit of a silicon-based material on the surface to be treated (a deposit which may moreover be continuous or discontinuous), the treatment gas then containing a carrier gas, such as nitrogen or argon, a silicon precursor gas, and oxygen or a gas capable of releasing oxygen.

Quite logically, the work carried out by the Applicant Company in comparing deposits made on a polymer surface (polypropylene) according to the invention with deposits made under filamentary discharge, show structures and therefore properties which are very different.

Thus, by way of illustration, taking the example of the surface roughness of the deposit, after a treatment time of 90 seconds in a discharge set up according to the invention in a nitrogen/monosilane mixture with 90 ppm silane, the surface roughness observed for the deposits is almost 10 times less than for deposits formed with a filamentary discharge using the same treatment time.

What is claimed is:

1. Method for treating a surface with a plasma at atmospheric pressure, comprising the steps of:
    introducing a treatment gas comprising one or more components into a treatment reactor, the treatment reactor comprising two exciting electrodes separated by an inter-electrode space, in which the surface to be treated is arranged between the two exciting electrodes; and
    applying a supply voltage to the two electrodes so as to cause a discharge in a region of the treatment gas,
    wherein the supply voltage is an AC voltage having an amplitude and a frequency adapted to maintain (1) at least a portion of the components in the gas in an excited state, and/or (2) the presence of electrons, in the region in which the discharge is established between two successive half cycles of the supply voltage, wherein the amplitude and the frequency are in a predetermined range effective to ensure a uniform discharge which is filamentary discharge free.

2. Method for treating a surface according to claim 1, wherein the surface to be treated generates species liable to de-excite an excited or unstable species in the gas in the region in which the discharge is established,
    wherein said species liable to de-excite the excited or unstable species in the gas is limited by implementing one or more of the following measures:
        i) the treatment gas includes at least one component which interacts with said species liable to deexcite the excited or unstable species in the gas;
        j) a power of the discharge is controlled, in order thus to control a rate at which said species liable to de-excite the excited or unstable species in the gas are generated;
        k) a rate at which the treatment gas is replenished in the inter-electrode space is controlled.

3. Method for treating a surface according to claim 1, wherein the amplitude of the supply voltage lies between about 5 kV and 30 kV, and the frequency lies between about 200 Hz and 35 kHz.

4. Method for treating a surface according to claim 1, wherein the amplitude of the supply voltage lies between about 5 kV and 30 kV and the frequency of the voltage is less than or equal to 15 kHz.

5. Method for treating a surface according to claim 1, further comprising the steps of introducing the treatment gas into the interelectrode space with a non-zero gas velocity of 10 m/s or less.

6. Method for treating a surface according to claim 1, wherein the treatment gas includes one or more of nitrogen, argon, silicon precursor gases, oxygen and an oxidizing element.

7. Method for treating a surface according claim 1, wherein the inter-electrode space has a thickness which is between about 0.5 and 5 mm.

8. Method for treating a surface according to claim 1, comprising depositing a silicon-based material on said surface, wherein the treatment gas includes a carrier gas, a silicon precursor gas, and oxygen or an oxidizing element.

9. Method for treating a surface according to claim 1, further comprising the step of introducing the treatment gas into the inter-electrode space without replenishing the treatment gas.

10. Method for treating a surface of an article with a plasma at atmospheric pressure, comprising the steps of:

introducing a treatment gas comprising one or more components into a treatment reactor, the treatment reactor comprising two exciting electrodes separated by an inter-electrode space, in which the surface to be treated is arranged between the two exciting electrodes; and applying a supply voltage to the two electrodes so as to cause a discharge in a region of the treatment gas, wherein the supply voltage is an AC voltage having an amplitude from about 5 kV to about 30 kV and a frequency from about 200 Hz to about 35 kHz, said amplitude and frequency being selected to maintain (1) at least a portion of the components of the gas in an excited state, and/or (2) the presence of electrons, in the region in which the discharge is established between two successive half-cycles of the supply voltage, wherein the amplitude and the frequency are in a predetermined range effective to ensure a uniform discharge which is filamentary discharge free.

11. Method for treating a surface according to claim 10, further comprising introducing the treatment gas into the inter-electrode space with a non-zero gas velocity of 10 m/s or less.

12. Method for treating a surface according to claim, 10, wherein at least one of the electrodes is covered with a dielectric or semiconductor material having a thickness from 500 microns to 2 mm.

13. Method for treating a surface according to claim 10, further comprising introducing the treatment gas into the inter-electrode space without replenishing the treatment gas.

* * * * *